(12) United States Patent
Cavallaro

(10) Patent No.: US 9,385,671 B2
(45) Date of Patent: Jul. 5, 2016

(54) CONTROL CIRCUIT FOR LOW NOISE AMPLIFIER AND RELATED DIFFERENTIAL AND SINGLE-ENDED AMPLIFICATION DEVICES

(71) Applicant: STMicroelectronics S.r.l., Agrate Brianza (IT)

(72) Inventor: Marco Orazio Cavallaro, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/707,232

(22) Filed: May 8, 2015

(65) Prior Publication Data
US 2015/0333713 A1 Nov. 19, 2015

(30) Foreign Application Priority Data

May 14, 2014 (IT) .............................. MI2014A0885

(51) Int. Cl.
| | |
|---|---|
| H03F 3/45 | (2006.01) |
| H03F 1/02 | (2006.01) |
| H03F 1/30 | (2006.01) |
| H03F 3/193 | (2006.01) |
| H03G 1/00 | (2006.01) |

(52) U.S. Cl.
CPC .......... *H03F 3/45071* (2013.01); *H03F 1/0205* (2013.01); *H03F 1/301* (2013.01); *H03F 3/193* (2013.01); *H03F 3/45179* (2013.01); *H03G 1/0029* (2013.01); *H03F 2200/18* (2013.01); *H03F 2200/294* (2013.01); *H03F 2200/72* (2013.01); *H03F 2203/45112* (2013.01); *H03F 2203/45244* (2013.01); *H03F 2203/45306* (2013.01)

(58) Field of Classification Search
None
See application file for complete search history.

(56) References Cited

U.S. PATENT DOCUMENTS

| | | | | | |
|---|---|---|---|---|---|
| 5,065,112 | A * | 11/1991 | Ishiguro | ................ | H03F 1/3211 330/260 |
| 5,481,224 | A * | 1/1996 | Kimura | ................. | H03F 1/3211 330/253 |
| 5,635,884 | A * | 6/1997 | Fujii | ..................... | H03F 1/3211 331/117 R |
| 2009/0141520 | A1 * | 6/2009 | Grande | ............. | H02M 3/33523 363/21.16 |
| 2009/0289711 | A1 | 11/2009 | Aiba | | |
| 2009/0289930 | A1 * | 11/2009 | Nishimura | ........... | G09G 3/2011 345/211 |
| 2013/0127536 | A1 | 5/2013 | Cavallaro et al. | | |
| 2015/0185754 | A1 * | 7/2015 | Liu | ........................ | G05F 1/463 323/313 |

OTHER PUBLICATIONS

IT Search Report and Written Opinion for MI2014A000885 dated Apr. 21, 2015 (10 pages).

(Continued)

*Primary Examiner* — Patricia T Nguyen
(74) *Attorney, Agent, or Firm* — Gardere Wynne Sewell LLP

(57) ABSTRACT

A circuit includes a first pair of transistors connected in parallel between a first node and a second node with a diode-connected transistor coupled to the second node. A second pair of transistors has current terminals connected at a third node. A first and second current sink transistors are connected in a current mirror configuration with the diode-connected transistor and further coupled to the third node. A first differential amplifier has an output coupled to control terminals of the first and third transistors and an input coupled to a further current node of the third transistor. A second differential amplifier has an output coupled to control terminals of the second and fourth transistors and an input coupled to a further current node of the fourth transistor.

16 Claims, 11 Drawing Sheets

(56) References Cited

OTHER PUBLICATIONS

Hong Zhang et al: "Fully Differential CMOS LNA and Down-Conversion Mixer for 3-5 GHz MB-OFDM UWB Receivers," Radio-Frequency Integration Technology, 2007, RFIT 007. IEEE International ONAL Workshop on, IEEE, PI, Dec. 1, 2007, pp. 54-57, XP031210949.

Saito, Ryutaro, et al: "A 1.8-V 73-dB Dynamic-Range CMOS Variable Gain Amplifier," Tokyo University of Science, Dept. of Electrical Engineering, IEEE, 2003 (pp. 301-304).

Heim, P, et al: "MOS Cascode-Mirror Biasing Circuit Operating at Any Current Level With Minimal Output Saturation Voltage," Electronics Letters, Apr. 27, 1995, vol. 31, No. 9 (pp. 690-691).

Lee, Hyein, et al: "Analysis of the Effect of AC Noise on DC Bias of VGA for UHF RFID Using Chip-Package Co-Modeling and Simulation," 2007 9th Electronics Packaging Technology Conference, IEEE 2007 (pp. 591-594).

\* cited by examiner

US 9,385,671 B2

CONTROL CIRCUIT FOR LOW NOISE AMPLIFIER AND RELATED DIFFERENTIAL AND SINGLE-ENDED AMPLIFICATION DEVICES

PRIORITY CLAIM

This application claims priority from Italian Application for Patent No. MI2014A000885 filed May 14, 2014, the disclosure of which is incorporated by reference.

TECHNICAL FIELD

This disclosure relates to electronic amplifiers and more in particular to a control circuit for generating regulated control voltages for controlling a single-ended or differential low noise amplifier.

BACKGROUND

A typical receiver chain of modern transceivers includes a low noise amplifier (LNA), a down-converter (MIXER) that receives in input the signal amplified by the LNA an oscillating signal generated by a Voltage Controlled Oscillator (VCO), a low-pass (or band-pass) filter and an analog-to-digital converter (ADC), as schematically shown in FIG. 1.

The receiver chain, although optimized to work with an extremely low signal, has to be able to deal with high level signals or with a useful signal corrupted by high level disturbances or interferers. For these reasons, a variable gain amplifier (VGA) is present in the receiver (RX) chain as a separate block or is embedded in the LNA, as shown in FIG. 2.

The VGA is generally driven by an automatic gain control (AGC) circuit, which probes the level of signals in one or more points of the RX chain, in order to provide a signal at the highest possible level in input to the ADC without overloading the stages upstream.

A known topology of a LNA is shown in FIGS. 3A and 3B and uses a cascode-buffer stage between a differential amplification stage M1a, M2a, the trans-conductance gain Gm of which is determined by a control voltage VB1, to increase reverse isolation, and the load $R_L$. The gain of the shown LNA is controlled through the differential amplification stage M1a, M2a, and through the depicted voltage-based Gilbert cell (M1b, M2b, M3b, M4b), that acts as a variable gain stage without effects on the output bias voltage and output pole frequency.

The three control voltages VB1, VB2, VB3 are accurately generated for controlling this LNA in order to obtain a precisely determined gain value.

A control circuit to provide the control voltages $V_{B1}$, $V_{B2}$ and $V_{B3}$ to the voltage based Gilbert cell are proposed in References 1-3 identified herein and is shown in FIG. 4. It comprises two replica circuits $M_a$, $M_{a'}$, $M_b$, $M_{b'}$, and a current mirror allowing to impose the same current in the two replica circuits. The transistors $M_{con}$, $M_{a'}$ and $M_{b'}$ connected in a diode configuration make the transistors $M_d$ and $M_{d'}$ carry the desired currents $k \cdot I_1$ and $k \cdot I_2$, respectively. Unfortunately, the drain voltage of the transistors $M_d$ and $M_{d'}$ are not accurate replicas of the corresponding voltages of the Gilbert-cell of the LNA of FIG. 3B, thus making difficult to control accurately the overall gain.

SUMMARY

In an embodiment, a control circuit is presented which is capable of generating regulated control voltages for controlling a low noise amplifier including a transconductance amplification stage and a current steering stage. Thanks to the disclosed architecture, the control circuit of this disclosure provides the control voltages to be applied to the low noise amplifier of FIG. 3A, for example, for obtaining desired gain and current consumption.

The control circuit may be used with a single-ended or a differential low noise amplifier to form a single-ended or differential amplification device, respectively, that may be included in a receiver chain of a transceiver.

DETAILED DESCRIPTION

Figure 5:
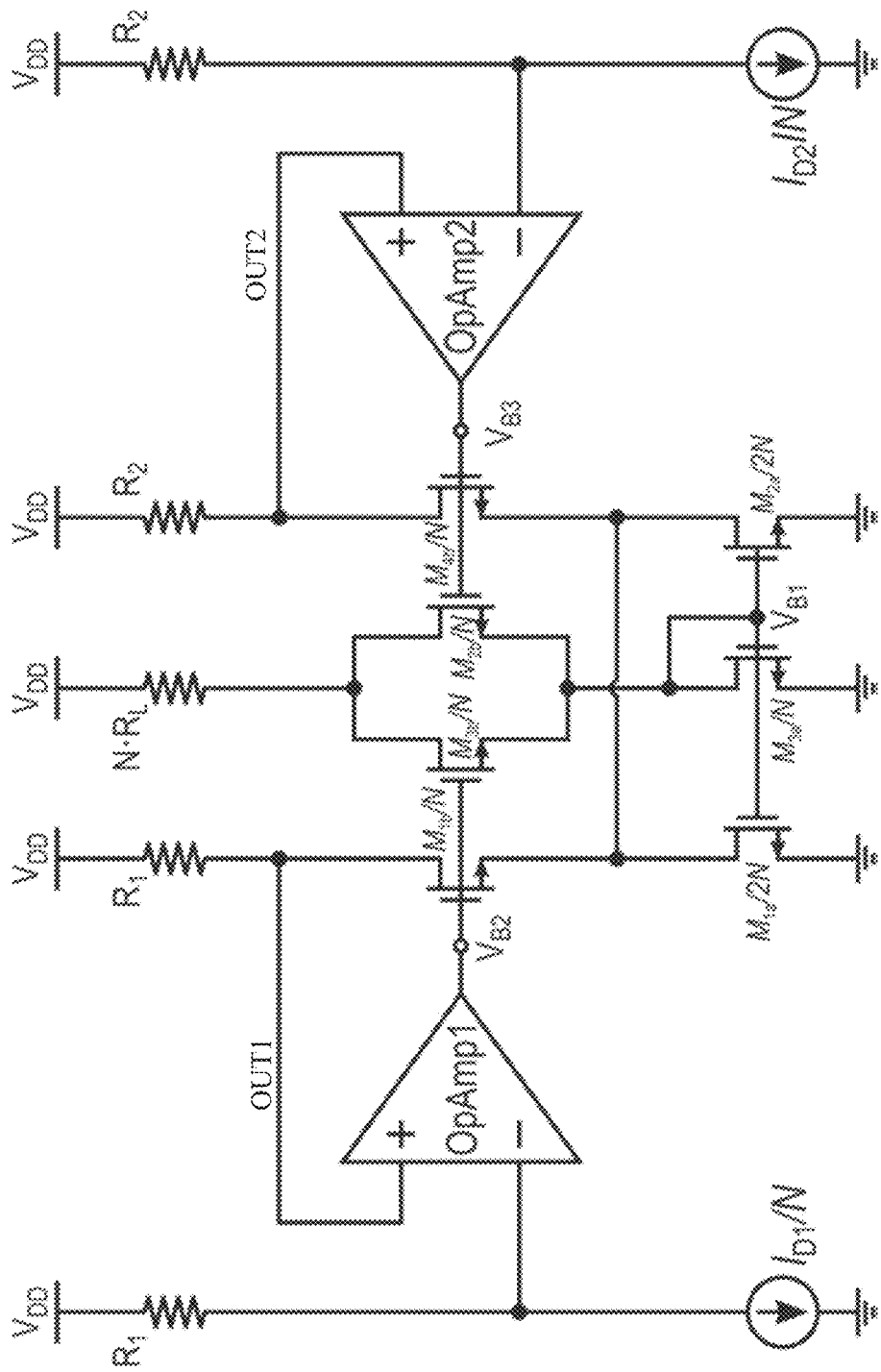
FIG. 5 depicts a control circuit of this disclosure for generating regulated control voltages for a low noise amplifier.

A control circuit is depicted in FIG. 5. It substantially comprises a first pair of matched transistors M2b/N and M3b/N respectively controlled by the control voltages VB3 and VB2; a diode-connected transistor M3a/N coupled to sink currents flowing through the transistors M2b/N and second transistor M3b/N; a second pair of matched transistors M4b/N and M1b/N configured to be respectively controlled by the control voltages VB3 and VB2 and to generate respective single-ended output voltages OUT2 and first OUT1; transistors M2a/2N and M1a/2N connected to mirror a current flowing through the diode-connected transistor M3a/N and to sink currents flowing through the transistors M4b/N and M1b/N; an operational amplifier OpAmp1 configured to generate the control voltage VB2 as an amplified replica of the difference between the output voltage OUT1 and a first reference voltage; and another operational amplifier OpAmp2 configured to generate the control voltage VB3 as an amplified replica of the difference between the second output voltage OUT2 and a second reference voltage. The control voltage VB1 is the voltage at the control terminal of the diode-connected transistor M3a/N.

The reference voltages VDD-R1*ID1/N and VDD-R2*ID2/N for the output voltages OUT1 and OUT2, respectively, determine the currents through the transistors M3b/N and M2b/N by fixing the control voltages VB2 and VB3 so as to force the currents ID1/N and ID2/N through the transistors M1b/N and M4b/N. If the transistor M3a/N is a N-times scaled replica of the matched transistors M1a and M2a of the low noise amplifier of FIG. 3B, the current flowing throughout the transistor M3a/N corresponds to a scaled replica of the bias current flowing throughout the transistors M1a and M2a, and the currents flowing throughout the transistors M3b/N and M2b/N correspond to a scaled replica of the bias currents ID1 and ID2 flowing throughout the transistors M3b and M2b, respectively.

Figure 1:
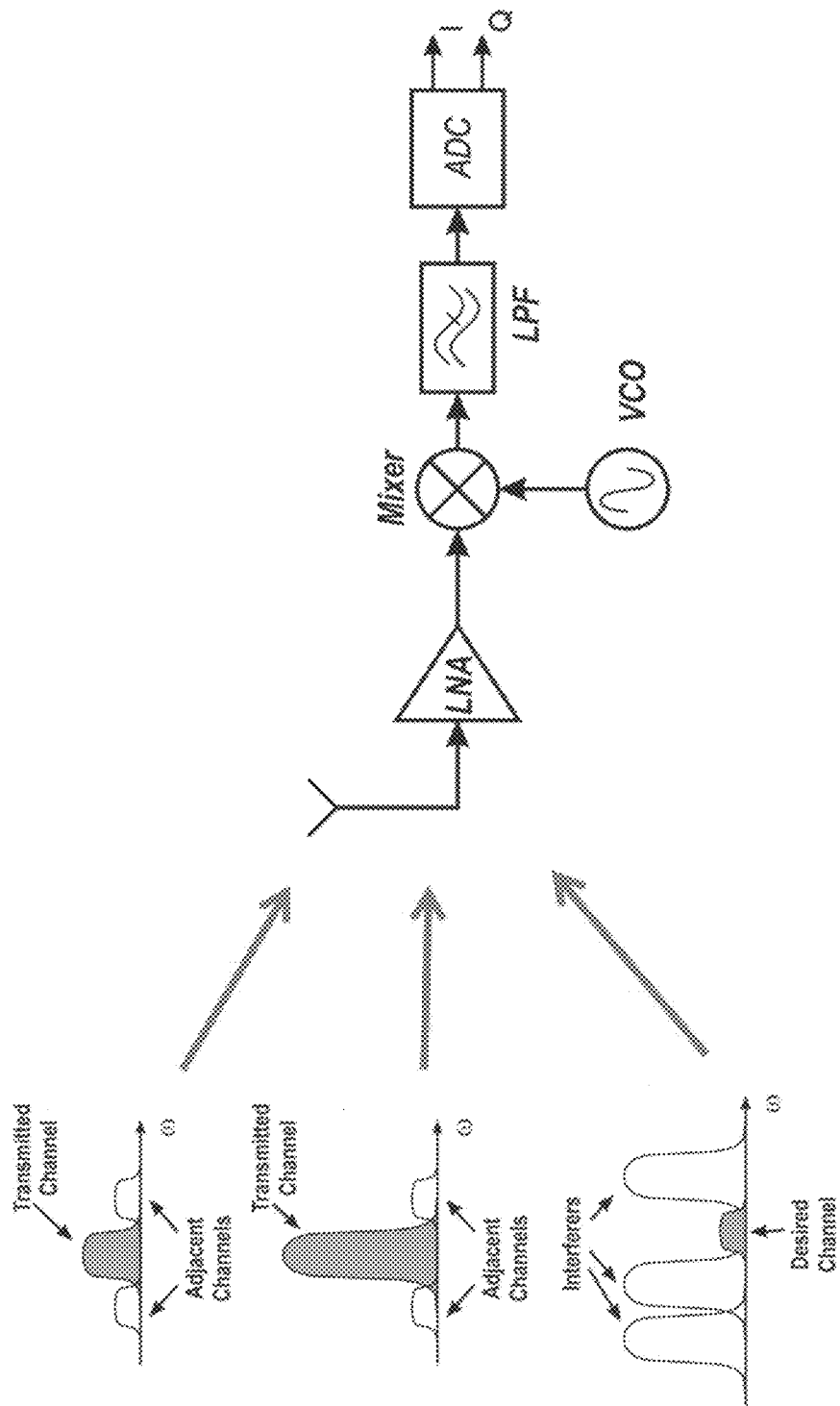
FIG. 1 depicts a receiver chain of a transceiver and frequency spectra of signals to be received.
Figure 2:
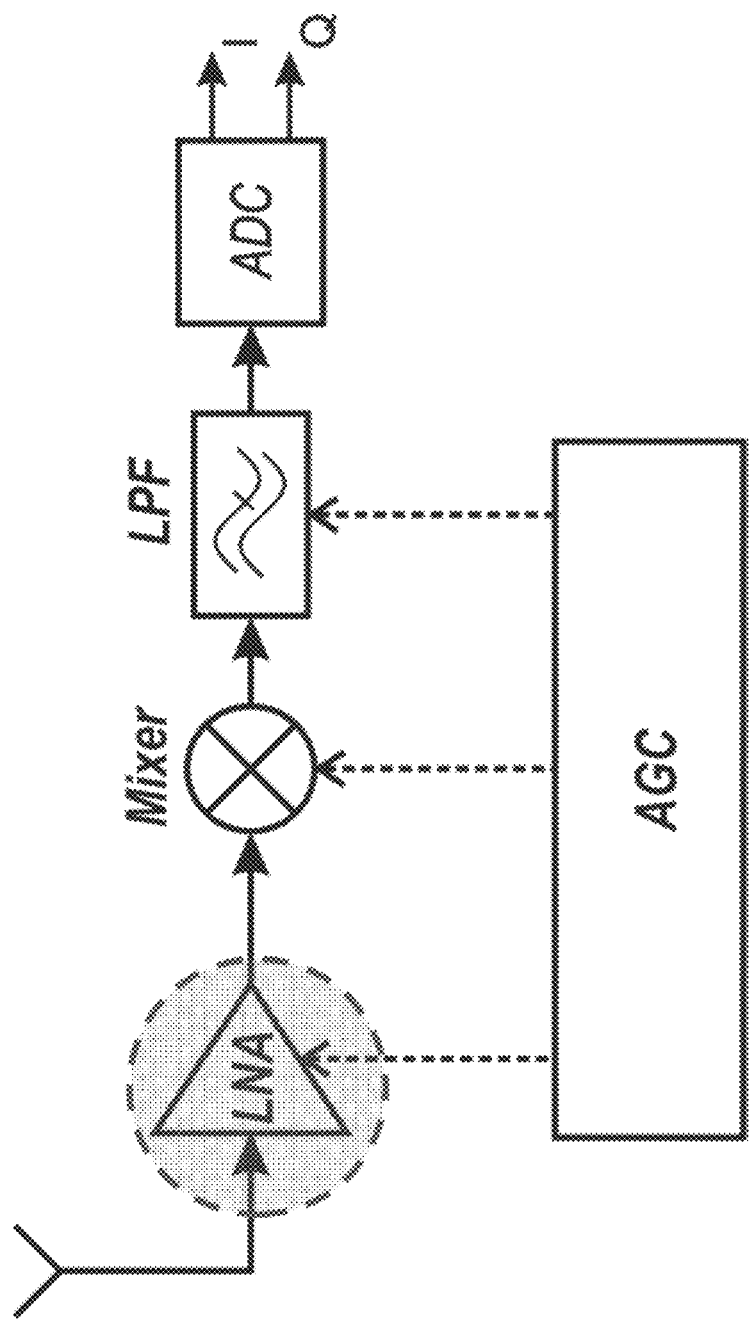
FIG. 2 depicts a receiver chain with automatic gain control.
Figure 3A:
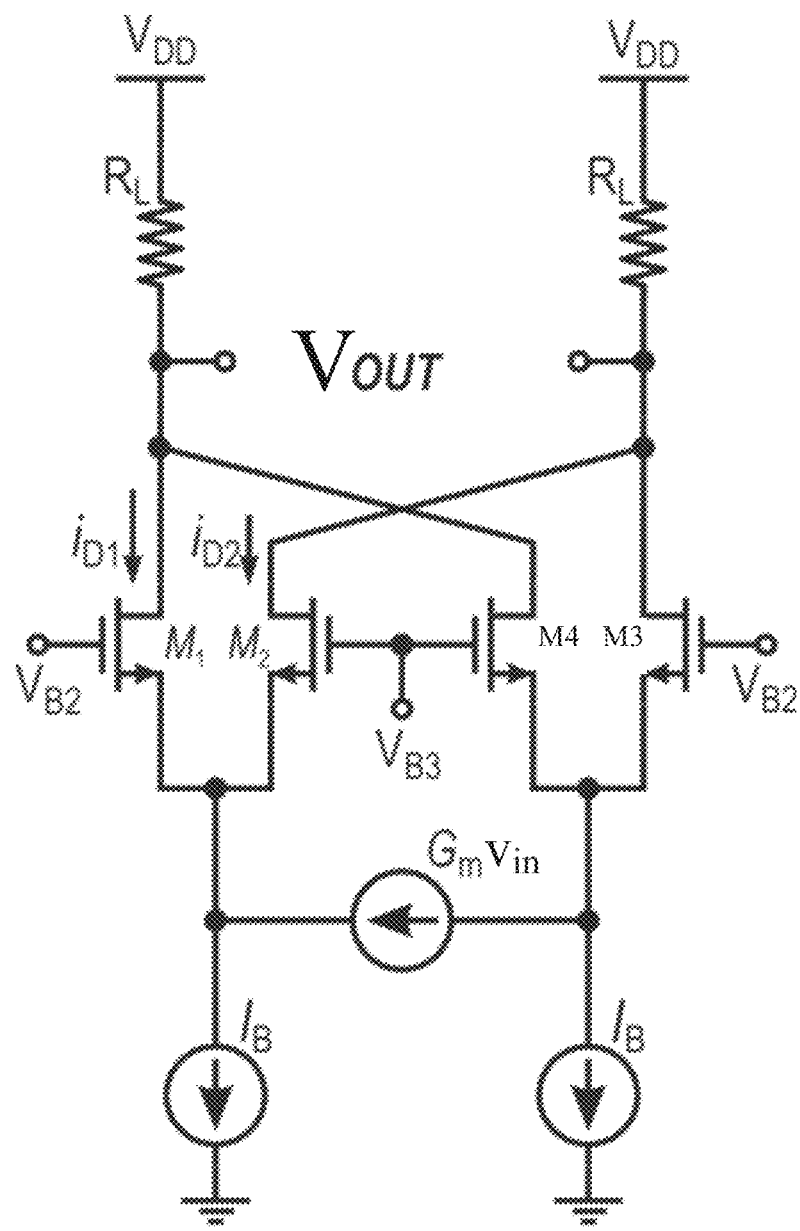
FIG. 3A depicts a low noise amplifier having a voltage based Gilbert cell configured as a current steering stage and a transconductance stage Gm the value of which is controlled by a control voltage.
Figure 3B:
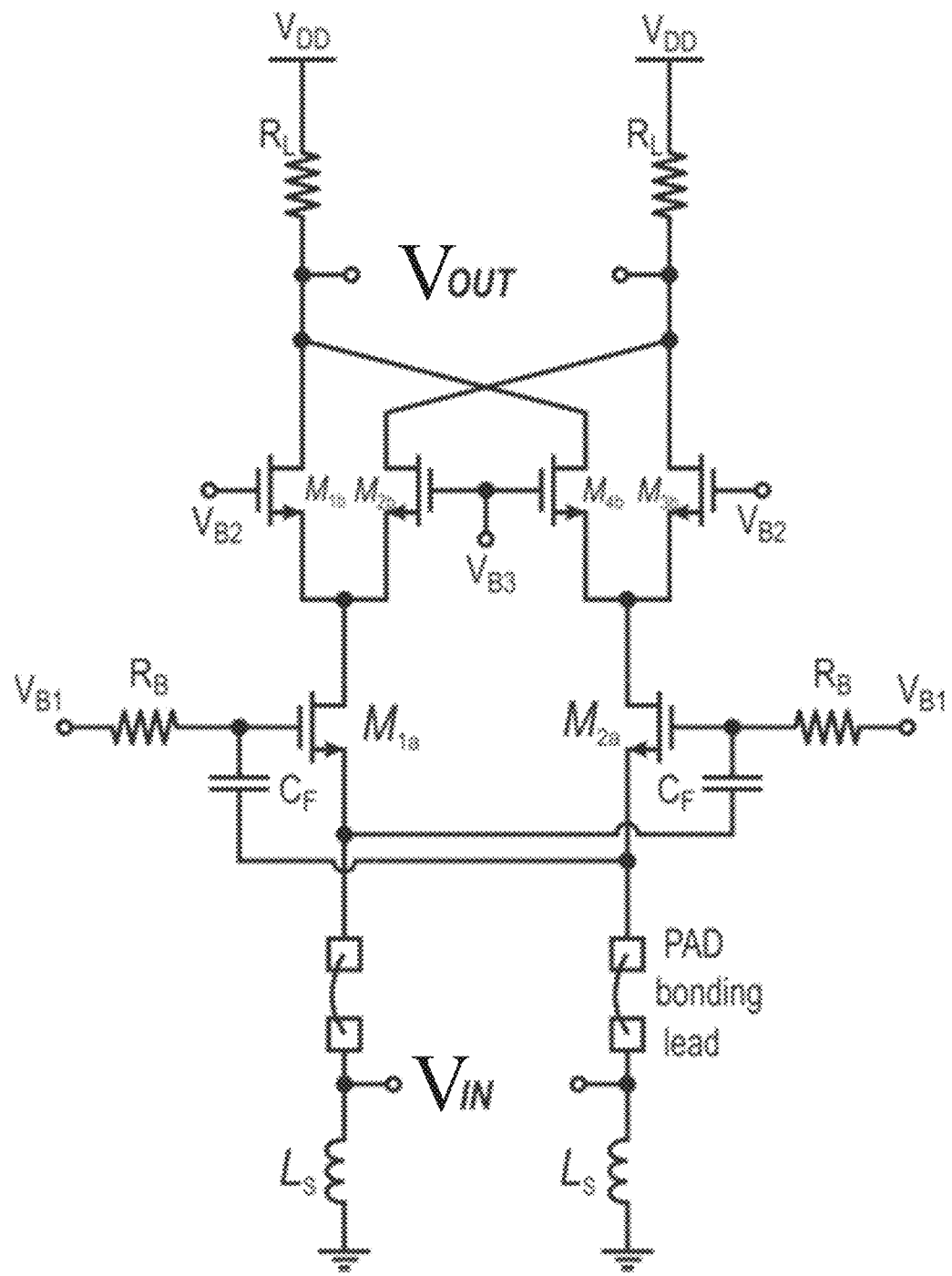
FIG. 3B depicts the low noise amplifier of FIG. 3A in which the transconductance stage comprises a differential pair of transistors with capacitive input cross-coupling controlled by a control voltage VB1.
Figure 4:
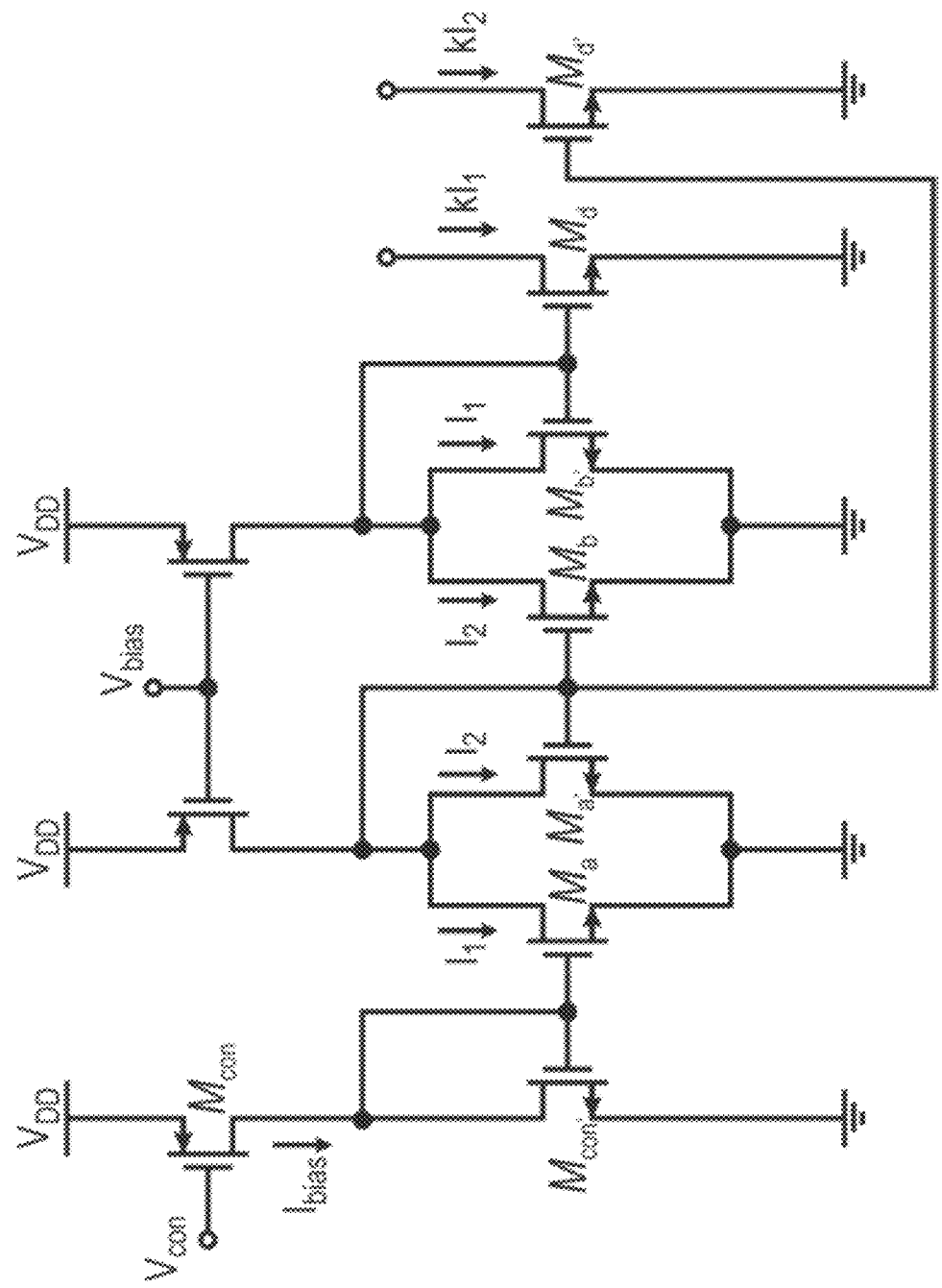
FIG. 4 depicts a control circuit that may be used to provide voltages for controlling a voltage based Gilbert cell.

The control circuit of FIG. 5 generates the control voltages VB1, VB2 and VB3 for forcing accurately controlled bias currents ID1 and ID2 throughout the transistors M1b, M3b and M2b, M4b, respectively, of the low noise amplifier of FIG. 3B. Therefore, it allows to control the gain of the LNA of FIG. 3B both in normal power conditions as well as in low power conditions. The total bias current IB (FIG. 3A) is the sum of the currents ID1 and ID2 and depends upon the desired noise figure or power consumption of the LNA. The value of the current $h_{D1}$, $I_{D2}$ and $R_1$, $R_2$ are adjusted to obtain a desired gain value of the LNA.

Figure 6:
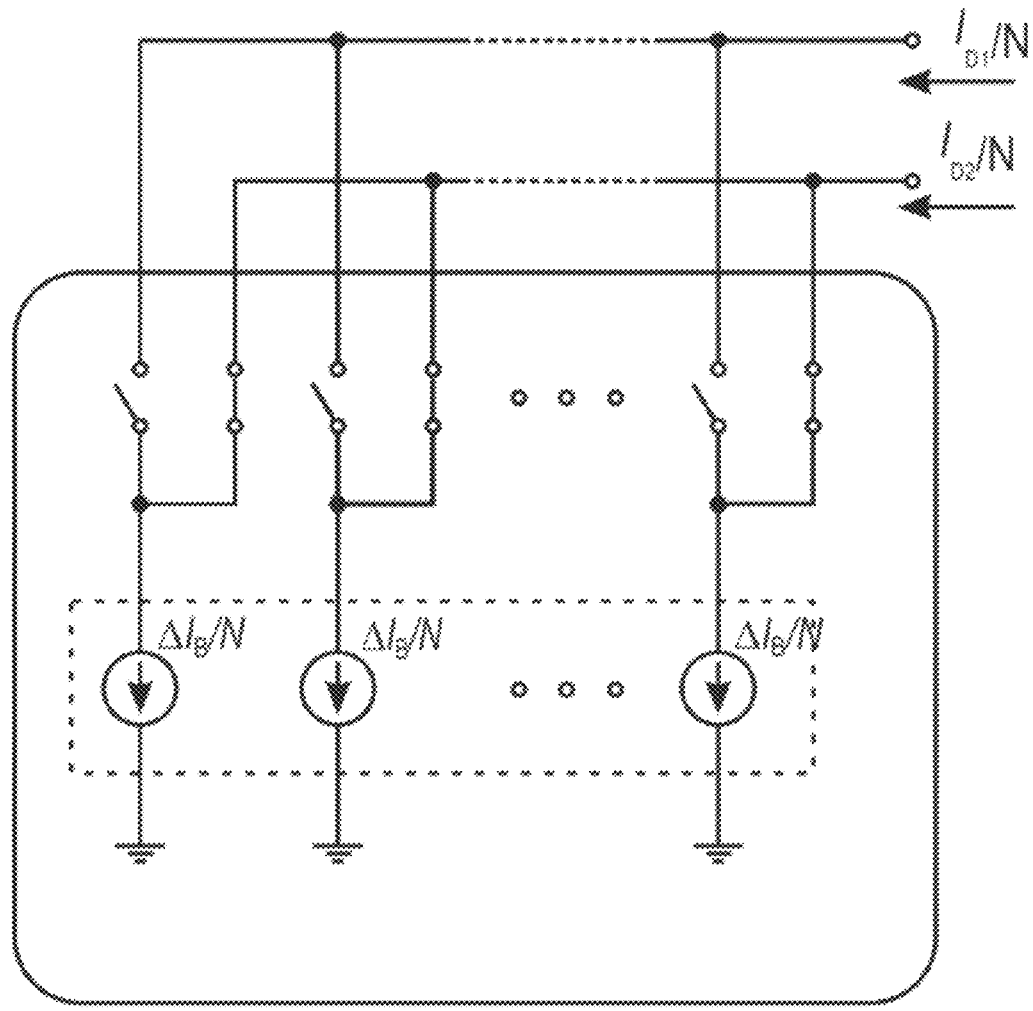
FIG. 6 depicts a current digital-to-analog converter for accurately generating the currents ID1/N and ID2/N.

A simple circuit allowing to generate the current $I_{D1}/N$ and $I_{D2}/N$ is shown in FIG. 6 and is basically a current digital-to-analog converter. The current steps $\Delta I_B$ may be relatively small for varying in a refined manner the currents ID1 and ID2.

The parameters of the control circuit of this disclosure may be analytically determined. In order to obtain a desired gain GAIN and a desired power consumption IB, the currents $I_{D1}$ and $I_{D2}$ may be chosen according to the following equations:

$$Gain = 2GmR_L \cdot \frac{\sqrt{I_{D1}} - \sqrt{I_{D2}}}{\sqrt{I_{D1}} + \sqrt{I_{D2}}}$$

$$I_{D1} + I_{D2} = I_B$$

$$R_1 = N \cdot R_L \left(1 + \frac{I_{D2}}{I_{D1}}\right)$$

$$R_2 = N \cdot R_L \left(1 + \frac{I_{D1}}{I_{D2}}\right)$$

The output pole is $$f_c = \frac{1}{2\pi R_L C_L}$$

where $C_L$ is the sum of the Mixer input capacitance with output parasitic capacitances.

Figure 7A:
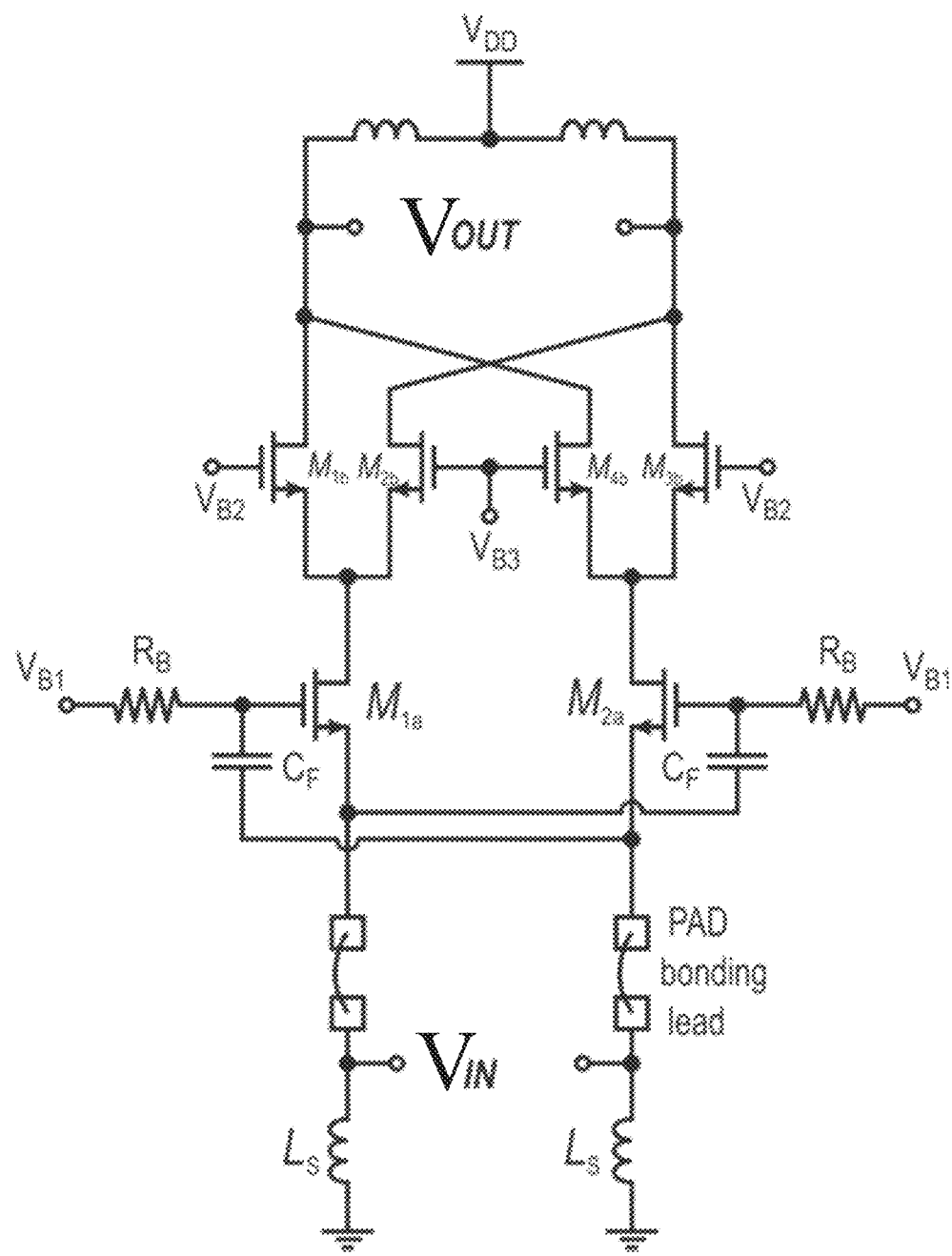
FIG. 7A depicts a narrow-band low noise amplifier that may be controlled by a control circuit of this disclosure.
Figure 7B:
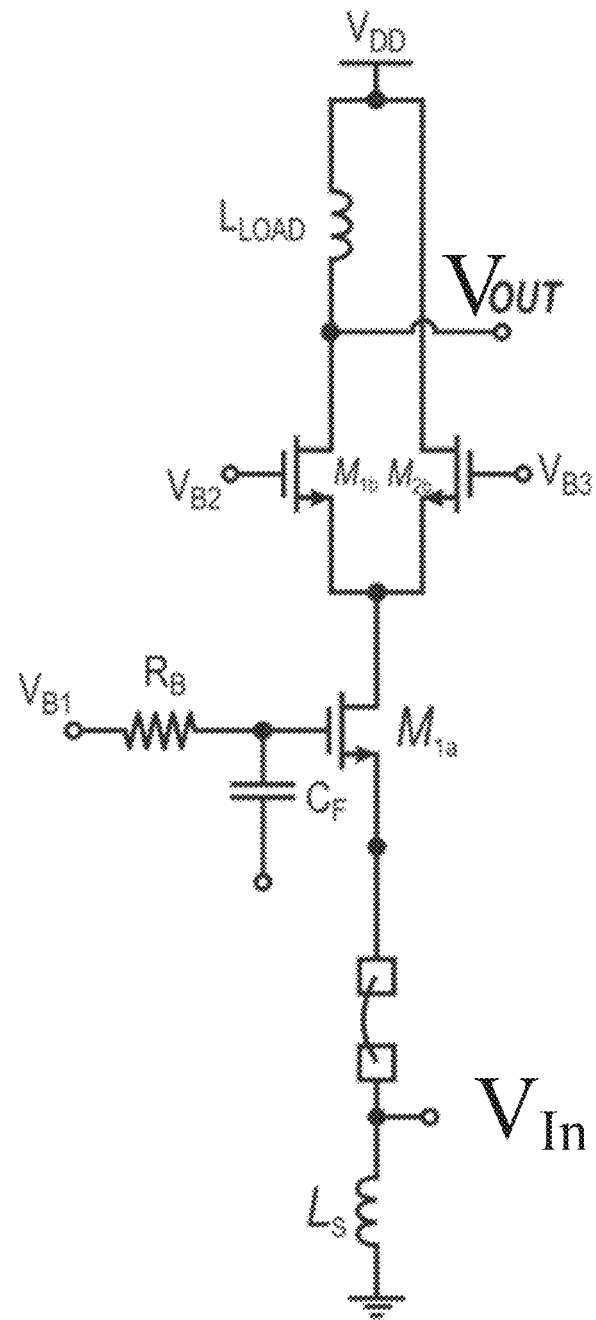
FIG. 7B is a single-ended low noise amplifier that may be controlled by a control circuit of this disclosure.

The control circuit of this disclosure may be used for controlling a LNA of FIG. 3A or 3B, or also for controlling a narrow-band differential LNA of the type shown in FIG. 7A or even a single-ended LNA of the type shown in FIG. 7B or HF amplifier.

Figure 8A:
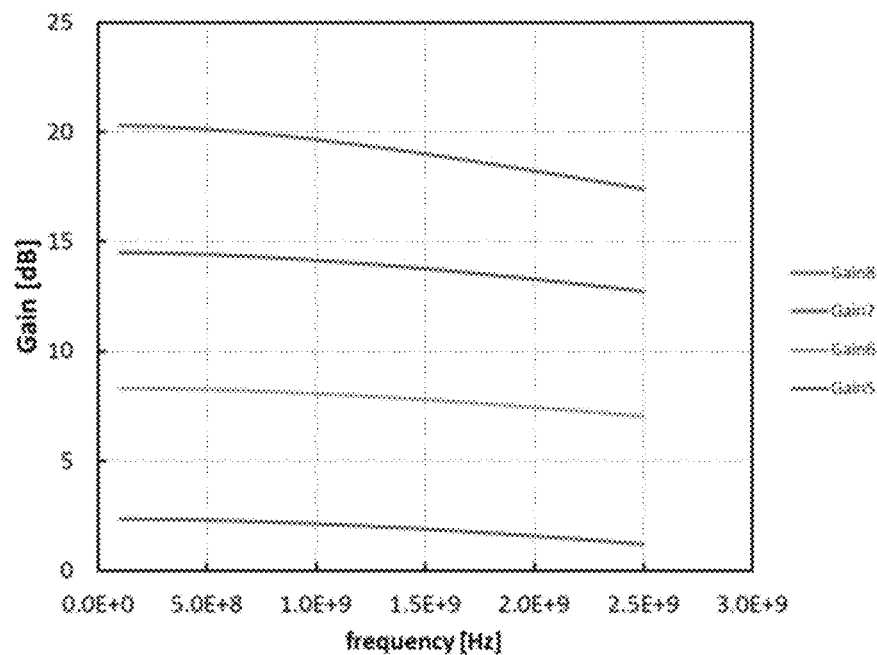
FIGS. 8A and 8B are exemplary graphs of the gain of a differential amplification device of this disclosure, comprising a LNA of FIG. 3B and the control circuit of FIG. 5, and of a prior differential amplification device, respectively, in a normal functioning mode.
Figure 8B:
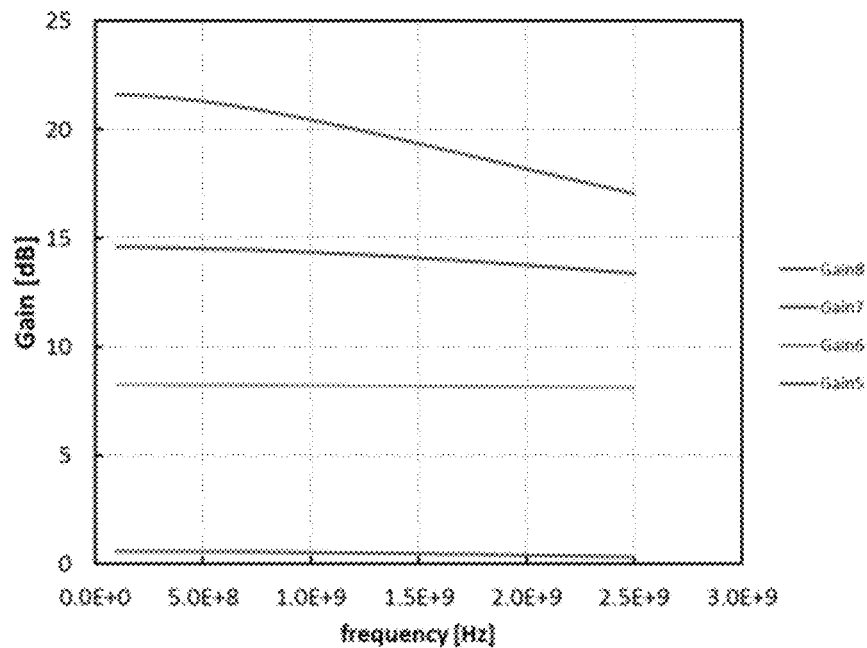
Figure 9A:
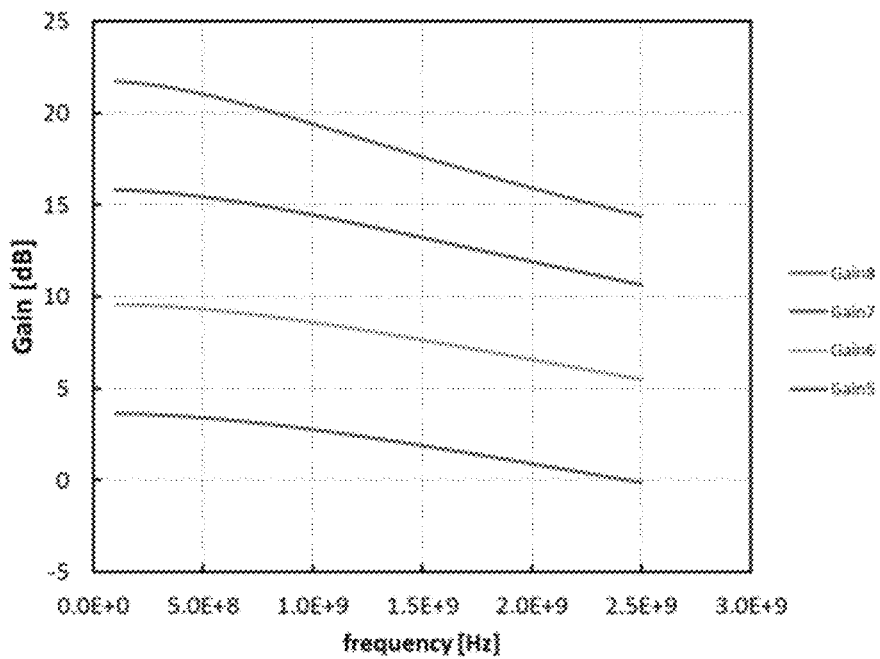
FIGS. 9A and 9B are exemplary graphs of the gain of a differential amplification device of this disclosure, comprising a LNA of FIG. 3B and the control circuit of FIG. 5, and of a prior differential amplification device, respectively, in a low-power functioning mode.
Figure 9B:
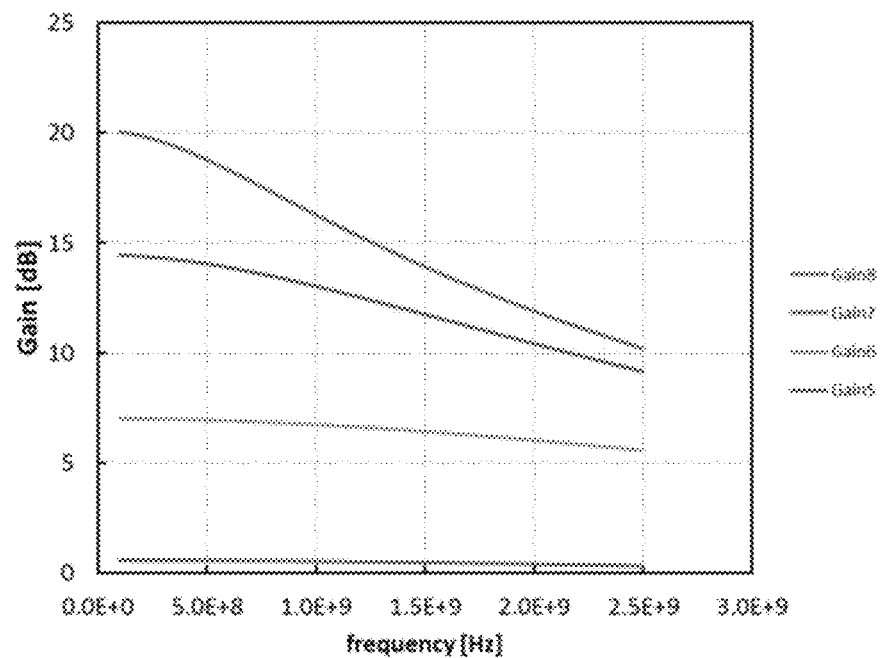

A prototype of an amplification device of this disclosure comprising a control circuit of FIG. 5 and a LNA of FIG. 3B has been designed in a TSMC 90 nm CMOS process. The current consumption can be reconfigured from 500 µA to 1 mA per branch and allows to have a noise figure (NF) of 2.3 dB, a 1 dB compression point of −8 dBm and a IIP3 of 2 dBm from 1.2V power supply at 915 MHz. The performance over the frequency in respect to prior amplification devices are compared respectively in FIGS. 8A, 8B in normal functioning conditions, and in FIGS. 9A, 9B in low-power functioning conditions for different gain values. The amplification device of this disclosure exhibits more accurate gain steps size over the frequency of the input signal than prior devices.

The claims as filed are integral part of this specification and are herein incorporated by reference.

REFERENCES

[1] Hyein Lee, Yujeong Shim, Hyungjeong Park, ChunghyunRyu, Changwook Yoon, Joungho Kim, "Analysis of the Effect of AC Noise on DC Bias of VGA for UHF RFID using Chip-package Co-modeling and Simulation," IEEE Proc. in Electronics Packaging Technology Conf. (EPTC), pp. 591-594, September 2007.

[2] P. Heim, M. A. Jabri, "MOS cascode-mirror biasing circuit operating at any current level with minimal output saturation voltage," IEEE Electronics Letters, vol. 31, no. 9, pp. 690-691, September 1995.

[3] R. Saito, K. Hosoda, A. Hyogo, T. Maruyama, H. Komuraki, H. Sato, K. Sekine, "A 1.8-V 73-dB dynamic-range CMOS variable gain amplifier," IEEE Proc. in Solid-State Circuits European Conference, pp. 301-304, Apr. 2003.

All of the foregoing references are incorporated herein by reference.

What is claimed is:

1. An apparatus, comprising a control circuit for generating a first control voltage, a second control voltage and a third control voltage, for controlling a low noise amplifier that includes a transconductance amplification stage controlled by said first control voltage, and a current steering stage controlled by said second control voltage and said third control voltage, said control circuit comprising:
a first pair of matched transistors, comprising first and second transistors having respective first current terminals connected in common and having respective second current terminals connected in common, and being respectively controlled by said third control voltage and said second control voltage;
a diode-connected transistor coupled to said second current terminals of the first pair of matched transistors to sink currents flowing there through, said first control voltage being the voltage at the control terminal of the diode-connected transistor;
a second pair of matched transistors comprising third and fourth transistors configured to be respectively controlled by said third control voltage and said second control voltage and to generate respective single-ended output voltages, having respective first current terminals connected in common, being of the same type of said first pair of matched transistors;
a fifth transistor and a sixth transistor connected to mirror a current flowing through said diode-connected transistor and to sink currents flowing through said second pair of matched transistors;
a first operational amplifier configured to generate said second control voltage as an amplified replica of a difference between said first output voltage and a first reference voltage; and a second operational amplifier configured to generate said third control voltage as an amplified replica of a difference between said second output voltage and a second reference voltage.

2. The apparatus of claim 1, further comprising:
a first bias network comprising a first current generator connected in series with a first resistor, said first bias network configured to generate said first reference voltage at a terminal in common between the first current generator and the first resistor;
a second bias network comprising a second current generator connected in series with a second resistor, said second bias network configured to generate said second reference voltage at a terminal in common between the second current generator and the second resistor;
third and fourth resistors, identical with said first and second resistors, respectively, and a fifth resistor connected as load resistors respectively of said fourth transistor, of said third transistor and of said first pair of matched transistors.

3. The apparatus of claim 1, further comprising:
a single-ended low noise amplifier comprising:
a single-ended transconductance amplifier having a gain determined by said first control voltage,
a differential pair of transistors connected as a current steering stage of an amplification transistor and controlled by said second and third control voltages, the transistors of said differential pair of transistors being replicas magnified by a factor N of the fourth transistor and of a first transistor in the first match pair of transistors.

4. The apparatus of claim 3, wherein said transconductance amplification stage comprises said amplification transistor controlled with said first control voltage, said amplification transistor being a replica magnified by a factor 2N of the sixth transistor.

5. The apparatus of claim 1, further comprising:
the differential low noise amplifier comprising:
a transconductance amplification stage having a gain determined by said first control voltage, and
a Gilbert cell coupled as a current steering stage of a differential amplification pair and controlled by said second and third control voltages, wherein the Gilbert cell comprises:
a second differential amplification pair controlled by said second control voltage and said third control voltage, and
a third differential amplification pair controlled by said third control voltage and said second control voltage,
wherein transistors of said second differential amplification pair are replicas magnified by a factor N of the fourth transistor and of the first transistor,
wherein transistors of said third differential amplification pair are replicas magnified by the factor N of the second transistor and of the third transistor.

6. The apparatus of claim 5, wherein said transconductance amplification stage comprises a differential amplification pair controlled with said first control voltage, wherein transistors of said differential amplification pair are replicas magnified by a factor 2N of the sixth transistor and of the fifth transistor.

7. The apparatus of claim 5, further including:
a first bias network comprising a first current generator connected in series with a first resistor, said first bias network configured to generate said first reference voltage at a terminal in common between the first current generator and the first resistor;
a second bias network comprising a second current generator connected in series with a second resistor, said second bias network configured to generate said second reference voltage at a terminal in common between the second current generator and the second resistor;
third and fourth resistors, identical with said first and second resistors, respectively, and a fifth resistor connected as load resistors respectively of said fourth transistor, of said third transistor and of said first pair of matched transistors.

8. The apparatus of claim 7, wherein said differential low noise amplifier further comprises: load resistors inserted in current paths of said Gilbert cell, being N-times scaled replicas of said fifth resistor.

9. The apparatus of claim 3, wherein the single-ended low noise amplifier is a circuit component of a receiver chain within a transceiver.

10. The apparatus of claim 5, wherein the differential low noise amplifier is a circuit component of a receiver chain within a transceiver.

11. An apparatus, comprising:
a first pair of transistors comprising first and second transistors connected in parallel between a first node and a second node;
a diode-connected transistor coupled to said second node;
a second pair of transistors comprising third and fourth transistors, wherein current nodes of the third and fourth transistors are connected at a third node;
a first current sink transistor coupled to said third node and connected in a current mirror configuration to said diode-connected transistor;
a second current sink transistor coupled to said third node and connected in a current mirror configuration to said diode-connected transistor;
a first differential amplifier having an output coupled to control terminals of the first and third transistors and having an input coupled to a further current node of said third transistor; and
a second differential amplifier having an output coupled to control terminals of the second and fourth transistors and having an input coupled to a further current node of the fourth transistor.

12. The apparatus of claim 11, wherein a first bias voltage is generated at the output of the first differential amplifier and a second bias voltage is generated at the output of the second differential amplifier and a third bias voltage is generated at a control terminal of the diode-connected transistor.

13. The apparatus of claim 12, further comprising a low noise amplifier comprising:
a first amplifier transistor having a control terminal coupled to receive the first bias voltage;
a second amplifier transistor having a control terminal coupled to receive the second bias voltage;
wherein current terminals of the first and second amplifier transistors are connected at a fourth node;
a third amplifier transistor coupled to the fourth node and having a control terminal coupled to receive the third bias voltage.

14. An apparatus, comprising:
a first pair of transistors comprising first and second transistors having drain terminals connected together at a first node and source terminals connected together at a second node;
a diode-connected transistor having drain and gate terminals connected to said second node;

a second pair of transistors comprising third and fourth transistors, wherein source terminals of the third and fourth transistors are connected together at a third node;

a first current sink transistor having a drain terminal connected to the third node and a gate terminal connected to the gate terminal of the diode-connected transistor;

a second current sink transistor having a drain terminal connected to the third node and a gate terminal connected to the gate terminal of the diode-connected transistor;

a first differential amplifier having an output coupled to gate terminals of the first and third transistors and having an input connected to a drain terminal of said third transistor; and a second differential amplifier having an output coupled to control terminals of the second and fourth transistors and having an input connected to a drain terminal of the fourth transistor.

15. The apparatus of claim 14, wherein a first bias voltage is generated at the output of the first differential amplifier and a second bias voltage is generated at the output of the second differential amplifier and a third bias voltage is generated at the gate terminal of the diode-connected transistor.

16. The apparatus of claim 14, further comprising a low noise amplifier comprising:
    a first amplifier transistor having a gate terminal coupled to receive the first bias voltage;
    a second amplifier transistor having a gate terminal coupled to receive the second bias voltage;
    wherein source terminals of the first and second amplifier transistors are connected together a fourth node;
    a third amplifier transistor having a drain terminal connected to the fourth node and having a gate terminal coupled to receive the third bias voltage.

\* \* \* \* \*